(12) United States Patent
Niv et al.

(10) Patent No.: US 8,553,322 B2
(45) Date of Patent: Oct. 8, 2013

(54) VARIABLE MAGNIFICATION OPTICS WITH SPRAY COOLING

(75) Inventors: Israel Niv, Los Altos Hills, CA (US); Prasad Sabbineni, San Ramon, CA (US); Thomas Kujawa, Fremont, CA (US)

(73) Assignee: DCG Systems, Inc., Fremont, CA (US)

( * ) Notice: Subject to any disclaimer, the term of this patent is extended or adjusted under 35 U.S.C. 154(b) by 866 days.

(21) Appl. No.: 12/610,235

(22) Filed: Oct. 30, 2009

(65) Prior Publication Data
US 2010/0110540 A1    May 6, 2010

Related U.S. Application Data (60) Provisional application No. 61/111,302, filed on Nov. 4, 2008.

(51) Int. Cl.
*G02B 21/00* (2006.01)

(52) U.S. Cl.
USPC ...................... 359/381; 324/762.05

(58) Field of Classification Search
USPC ............... 359/368, 381; 324/762.01–762.05
See application file for complete search history.

(56) References Cited

U.S. PATENT DOCUMENTS

| 5,004,307 | A | * | 4/1991 | Kino et al. .................... 359/356 |
| 5,515,910 | A | | 5/1996 | Hamilton et al. |
| 5,579,826 | A | | 12/1996 | Hamilton et al. |
| 6,594,086 | B1 | | 7/2003 | Pakdaman et al. |
| 6,621,275 | B2 | | 9/2003 | Cotton et al. |
| 6,828,811 | B2 | | 12/2004 | Hanson et al. |
| 6,836,131 | B2 | | 12/2004 | Cader et al. |
| 7,102,374 | B2 | | 9/2006 | Cader et al. |
| 7,327,514 | B2 | | 2/2008 | Uhl et al. |
| 7,504,845 | B2 | | 3/2009 | Cader et al. |
| 2002/0001126 | A1 | * | 1/2002 | Engelhardt ................... 359/380 |
| 2005/0094258 | A1 | | 5/2005 | Tanabe et al. |
| 2006/0164721 | A1 | * | 7/2006 | Uhl et al. ...................... 359/368 |
| 2006/0291041 | A1 | * | 12/2006 | Berns et al. ................... 359/368 |

FOREIGN PATENT DOCUMENTS

JP    2006-519359 A    8/2006

OTHER PUBLICATIONS

Japanese Office Action for Japanese Application No. 2009-253-146 dated Jul. 18, 2013.

* cited by examiner

*Primary Examiner* — Alessandro Amari
(74) *Attorney, Agent, or Firm* — Nixon Peabody LLP; Joseph Bach, Esq.

(57) ABSTRACT

A collection optics having variable magnification, and which enable changing magnification without stopping the spray cooling. The variable magnification is provided by a turret that carries several objectives of different magnifications. A frame is provided above the turret, wherein the spray cooling is provided. By rotating the turret and changing its elevation, different objectives of the turret can be "docked" to a docking port within the frame.

22 Claims, 7 Drawing Sheets

Figure 9

VARIABLE MAGNIFICATION OPTICS WITH SPRAY COOLING

RELATED APPLICATIONS

This Application claims priority from U.S. Provisional Application Ser. No. 61/111,302, filed Nov. 4, 2008, the entire disclosure of which is incorporated herein by reference.

BACKGROUND

1. Field

The subject invention relates to optical systems for examination of specimen and, more particularly, to such system that required cooling of the specimen, such as semiconductor chips.

2. Related Art

Various optical systems use objective lens to observe specimen. The objective lens may be tailored to provide a given magnification and field of view. Generally lower magnification provides larger field of view. Therefore, in some implementations several objective lenses are positioned on a turret so that different magnifications can be selected by the user. For example, a user may first select low magnification with high filed of view so as to locate a feature of interest on the specimen, and then select a higher magnification lens to examine the feature up close. For increased numerical aperture, it is also known to use a solid immersion lens (SIL) in conjunction with the objective. The arrangement of objective lens and a SIL can be referred to a collection optics. Such collection optics is particularly beneficial for observing specimen at high magnification, for example, for inspection and testing of semiconductor chips, as described in, for example, U.S. Pat. Nos. 6,594,086; 6,621,275 and 6,828,811. Examples of commercial systems utilizing such optics include laser voltage probing (LVP) such as the Ruby® and emission microscopy, such as the EmiScope® and Meridian®, both available from DCG Systems of Fremont, Calif.

When using such optics for inspection of chips, the encapsulation of the chip is removed, and the chip's substrate thinned, sometimes to 100 microns or so. The chip may also be stimulated by test vectors, e.g., using a conventional Automated Testing Equipment (ATE). Under such conditions, the chip tends to overheat, or at least operate at temperatures above its normal operating temperatures. Therefore, it has been suggested to use fluid spray to cool the chip. This is disclosed in, for example, U.S. Pat. Nos. 6,621,275; 6,836, 131 and 7,102,374.

However, a problem exists in the art that sometimes it is desirable to switch the magnification during inspection of the chip. Since the chip receives test vectors, it generates heat and needs to be constantly cooled. Consequently, if the cooling is stopped in order to switch magnification, the testing would also have to be stopped so as not to cause the chip to overheat. What is needed in the art, therefore, is a collection optics having variable magnification which enables switching of objective lens without having to turn off the fluid cooling.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

A collection optics having variable magnification, and which effectively incorporates spray cooling. In one embodiment the collection optics comprises a turret having several objective lenses. A fluid cooling incorporates a housing that is placed about the chip during testing. The housing has a docking port to which one of the objective lenses can dock at a time. When a different objective lens is needed, the first one is undocked from the cooling housing and the second lens is docked instead. During this switching process the cooling and testing can continue uninterrupted. In one embodiment the cooling housing incorporates a transparent window, such as a diamond window, while in others it incorporates a SIL.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 4A illustrates a cross section of an objective lens in a docked position, while

DETAILED DESCRIPTION

According to embodiments of the invention, a collection optics system enabling varying the magnification during testing and without stopping spray cooling is provided. In certain embodiments, the variable magnification is provided by a turret that carries several objectives of different magnifications. It should be appreciated, however, that any other means of switching between various objective lenses can be used, e.g., a linear slide having a plurality of objective lenses of different magnifications. The system is capable of both spatial and elevation movement. The spatial, i.e., X-Y, movement enables pointing the objective at a location of interest on the specimen, while the elevation, i.e., Z, movement, enables docking the objective onto the fluid spray cooling system. A frame is provided about the specimen to house the spray jets and enable docking of the objective lens. By rotating the turret and changing its elevation, different objectives of the turret can be "docked" to the frame. In some embodiments the frame includes a transparent window, such as a diamond window, while in others the frame includes a SIL. The cooling system may be, for example, a spray cool system, which sprays fluid onto the device under test (DUT).

Figure 1:
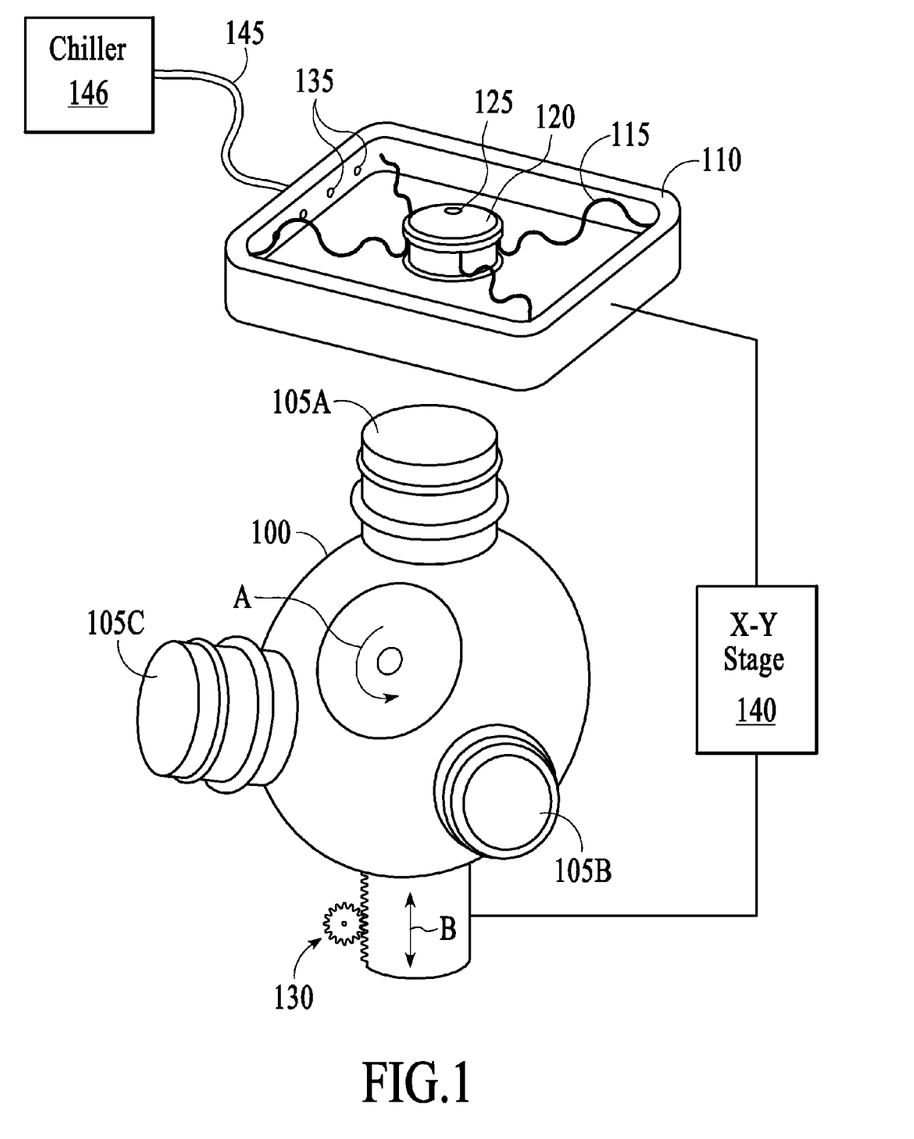
FIG. 1 illustrates an example of a collection optics having variable magnification, according to an embodiment of the invention.

FIG. 1 illustrates an example of a collection optics having variable magnification, according to an embodiment of the invention. In the example of FIG. 1, a turret 100 supports three objective lens housings 105A, 105B and 105C, each of which houses an objective lens of different magnification. The turret is mechanized so as to rotate, as shown by curved arrow A, and to move linearly up and down, as shown by arrow B. Rotation can be done by simply using a step motor, etc., while the linear motion can be done using, e.g., rack and pinion arrangement 130 or other known means.

A support frame 110 is provided above and in registration with the turret. During usage the frame is positioned about the DUT and provides fluid cooling. Jets or openings 135 are provided in the frame. The jets or openings 135 are supplied with cooled fluid from chiller 146 via house or pipe 145. The fluid may be cooled gas or liquid. The frame 110 supports a docking port 120 having window 125, which can be rigidly or resiliently attached to the frame 110. In this example the docking port 120 is attached resiliently to the frame 110, which is exemplified by springs 115. The window 125 may be, e.g., a diamond window that assists in heat removal from the specimen. Alternatively, it may be a SIL that provides higher numerical aperture, in which case the docking port also functions as, and may also be referred to as, a solid immersion lens housing. The frame 110 is in registration with the turret 100, so that when one of the objective housing 105A-105C is in the upright position, it is aligned with the docking port 120. Consequently, when one of the objective housing 105A-105C is in the upright position, the turret can be moved up so as to "dock" the objective housing onto the docking port 120. Also, in order to align the objective with a feature of interest on the specimen, the entire turret-frame arrangement may be affixed to a conventional x-y stage, as schematically illustrated by x-y stage 140. Conversely, the frame-turret arrangement can be fixed in x-y, while the specimen holder may be moved in x-y for registration.

Figure 2A:
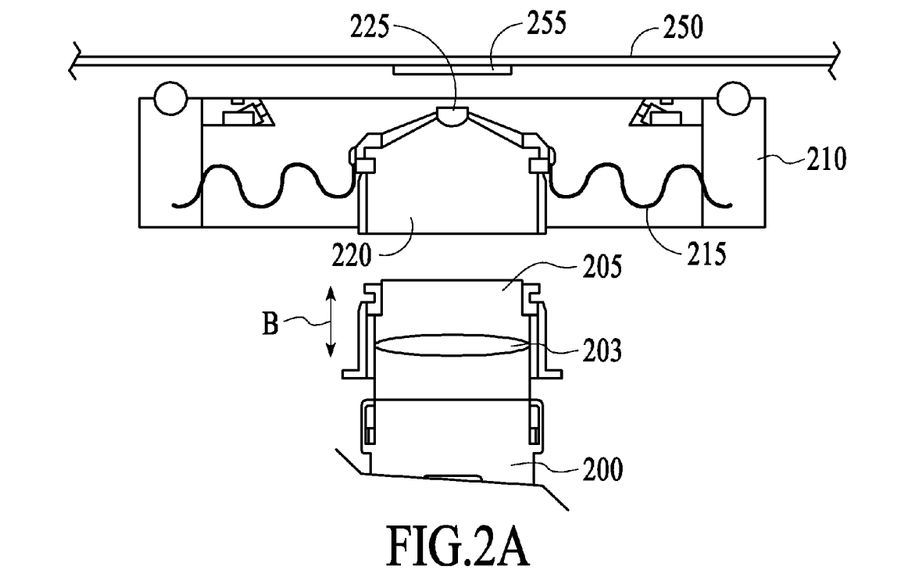
FIGS. 2A and 2B illustrate cross-section of an embodiment, such as that shown in FIG. 1.
Figure 2B:
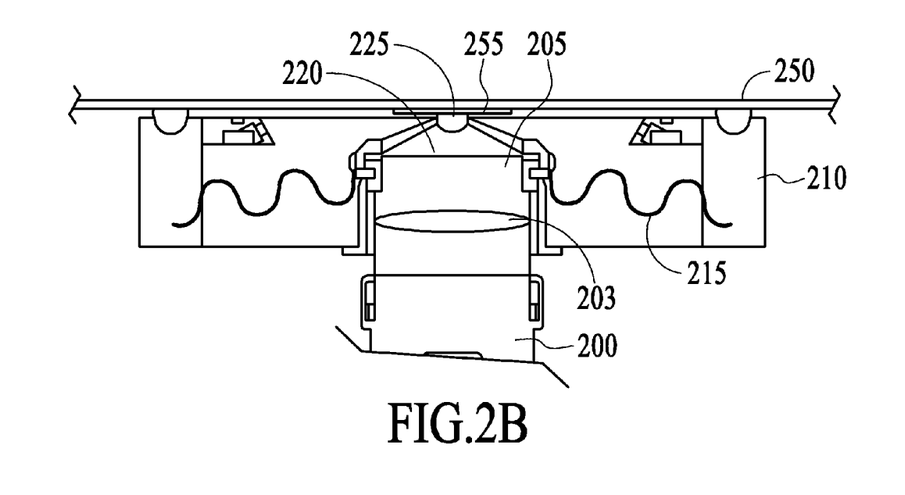

FIGS. 2A and 2B illustrate cross-section of an embodiment, such as that shown in FIG. 1. FIG. 2A shows turret 200 in partial view in its lower position, while FIG. 2B illustrate the turret 200 in its elevated position. Objective housing 205, which houses objective 203, is shown in an upright position and in x-y registration with the SIL housing 220. The docking port 220 is resiliently attached to frame 210 using spring loaded sleeve 215. The entire arrangement is provided below the specimen 255, e.g. DUT, which is attached to a specimen holder 250. To enable viewing of the specimen, the turret is moved up, as shown by arrow B, so as to dock the objective housing 205 onto the docking port 220. The docking position is illustrated in FIG. 2B. When the frame-turret arrangement is affixed to an x-y stage, the objective housing 205 docked to the docking port 220 can be moved together in x-y, so as to align with a feature of interest in specimen 255.

As explained with respect to the embodiment of FIG. 1, the docking port 220 may have a transparent window or a SIL. An interesting advantage of an embodiment having a SIL is that the docking port 220 is attached resiliently to the frame 210 using, e.g. spring-loaded sleeve 215. Consequently, after docking the objective housing 205 onto the docking port 220, as the turret 200 moves up and down small amounts, the docking port 220 moved with the objective housing 205. This enables controlling the "landing" of the SIL 225 onto the specimen. That is, under some circumstances it may be desirable to have the SIL 225 placed very close to the specimen 255, while under other circumstances it may be desirable to have the SIL 225 actually touching and sometimes even pressing against the specimen 255. By having the docking port 220 resiliently attached to frame 210, it allows for placing the SIL 225 at various distances from the specimen or touching and pressing against the specimen by simply moving the turret in the Z-direction, i.e., up or down, as illustrated in FIG. 2B. Then, once observation is completed, the turret can be moved down so as to disengage the objective housing 205 from the docking port 220, at which point the docking port 220 will assume its normal position illustrated in FIG. 2A, as dictated by the spring-loaded sleeve 215 or other resilient means. Thus, this embodiment is advantageous even when not using or incorporating spray cooling.

If the specimen 255 is to be viewed at different magnification and/or field of view, the turret 200 is rotated so that the proper objective is in the upright position aligned with the docking port 220. The turret 200 is then moved up so as to dock the new objective housing onto the docking port 220. In this manner, a single SIL can be used with several different objectives of different magnification and field of view. This is very important especially when viewing various small features, such as transistors in a chip. Using the embodiment shown in FIGS. 1 and 2, one may dock the smallest magnification objective onto the docking port, so as to obtain the highest filed of view. This situation makes it easy to navigate to the desired location on the specimen. Then, once x-y registration of the optics onto the desired location on the specimen is achieved, one can lower the turret so as to disengage the lowest magnification objective, rotate the turret so as to align a higher magnification objective with the docking port, and then move the turret upwards so as to dock the new objective onto the docking port. Since the docking port was already registered to the location of interest, the newly docked objective will be already registered to the same location. Of course, when more than two objectives are attached to the turret, one may have an intermediate step, wherein the lowest magnification objective is used to place the optics at the general area of interest on the specimen, the intermediate magnification objective is used to precisely place the optics at the location of interest, and then the highest magnification objective is used for the actual observation of the location of interest on the specimen.

Figure 3:
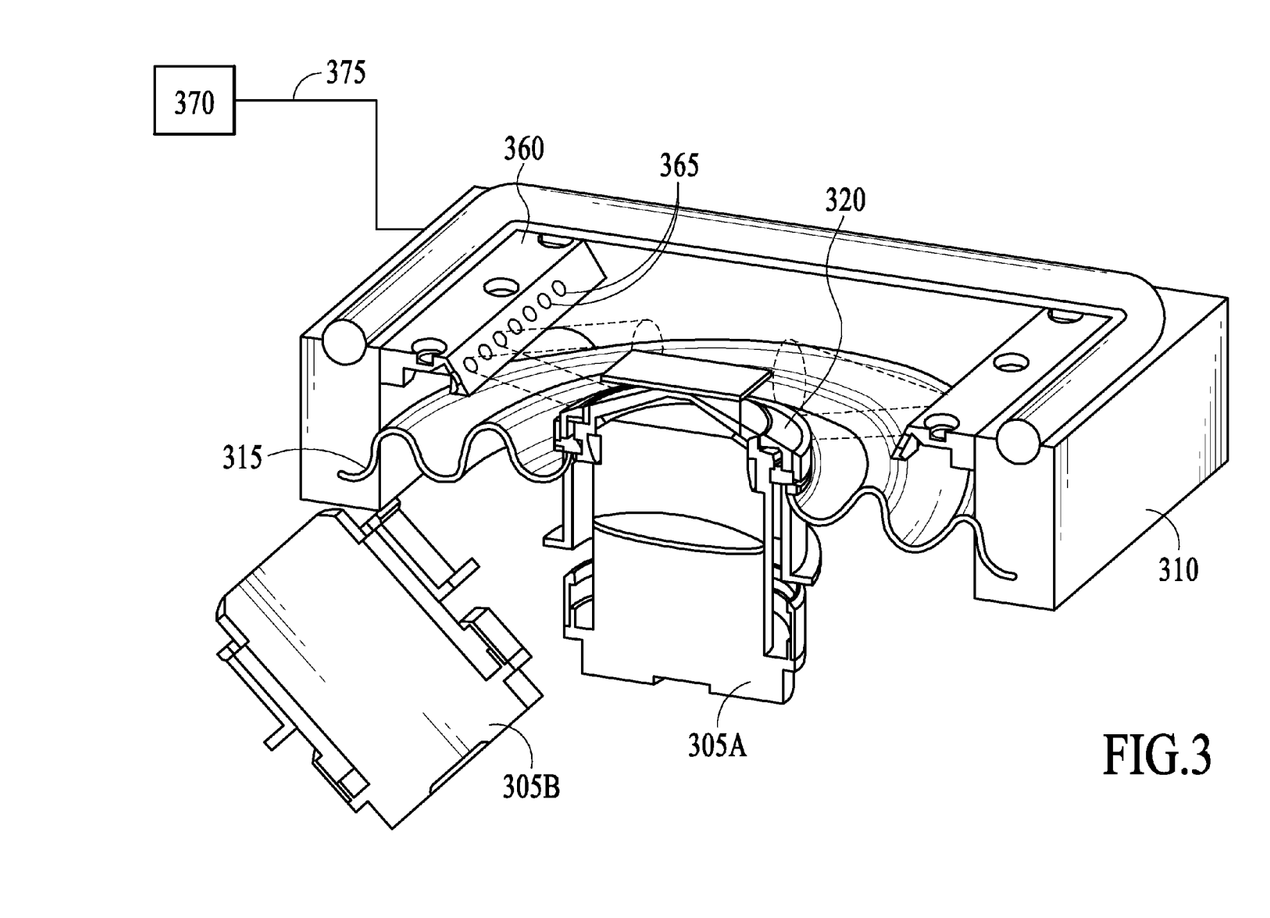
FIG. 3 illustrates a cross-section of another embodiment of the invention.

FIG. 3 illustrates a cross-section of another embodiment of the invention. For clarity, in FIG. 3 the turret is not illustrate, but it should be understood that objective housings 305A and 305B are attached to the turret as in the previous embodiments. In FIG. 3, objective housing 305A is shown docked to docking port 320. The docking port 320 is resiliently attached to the frame 310 using, e.g., spring-loaded sleeve 315. In this embodiment a spray cooling arrangement is added, so as to cool the specimen during observation. Therefore, the sleeve 315 also serves as a seal extending between the frame 310 and the docking port 320. In FIG. 3, two cooling blocks 360 are affixed to the frame 310. Each cooling block 360 has injection holes or jets 365, so as to spray coolant, e.g., chilled gas or liquid, onto the specimen. The coolant is supplied to the cooling block from a reservoir 370 via pipes 375.

Figure 4A:
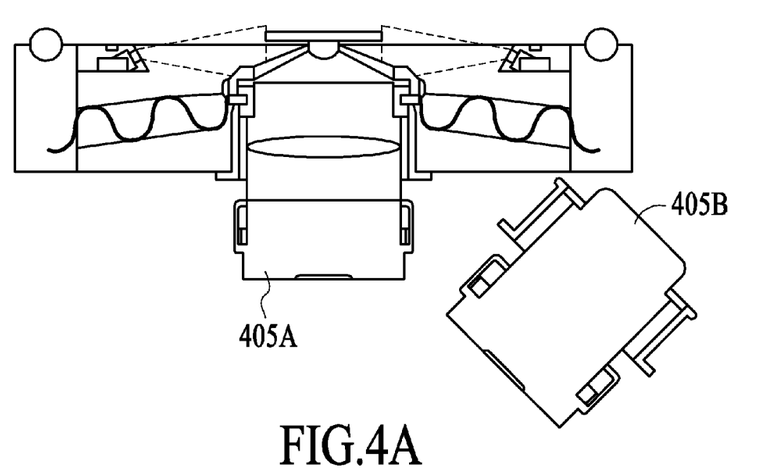
Figure 4B:
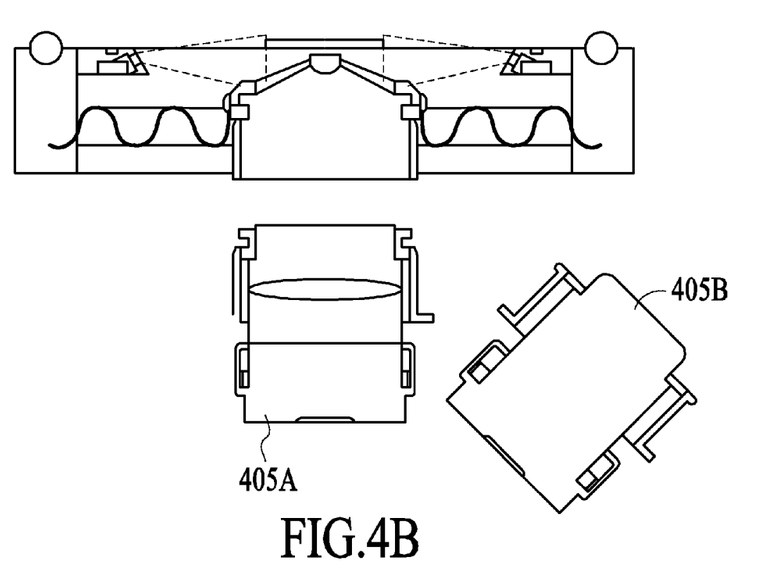
FIG. 4B illustrates the condition where the objective is in an undocked position.

FIG. 4A illustrates a cross section of an objective lens in a docked position, while FIG. 4B illustrates the condition where the objective is in an undocked position. In FIG. 4A, the turret is raised so as to dock the objective housing onto the SIL housing. Cooling fluid is sprayed onto the specimen so as to cool the specimen during observation. FIG. 4B illustrates the objective in an undocked position, disengaged from the docking port. In this position the spring-loaded sleeve returns the docking port to its free position, which is in x-y registration with the upright position of the turret. If needed, the turret can now be rotated so as to bring a different objective, e.g., 405B into the upright position. Then the turret can be raised so as to dock the new objective housing onto the docking port.

Figure 5:
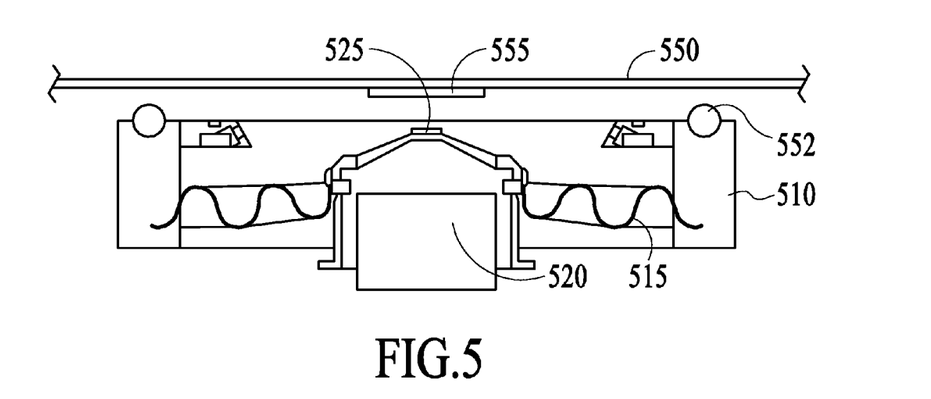
FIG. 5 is a schematic diagram illustrating an embodiments for systems according to the invention.

FIG. 5 illustrates another embodiment of the invention. In FIG. 5, the DUT 555 is attached to a holder or adapter 550. Frame 510 is positioned about the DUT 555. An optional seal or porous seal 552 may be provided between the frame 510 and adapter 550. A docking port 520 is resiliently affixed to the frame 510 via sealing sleeve 515. A transparent window 525 is provided on the docking port 520. The window 525 may be made of sapphire, diamond, etc., so that when it is in contact with the DUT 555 it may help in removing heat from the DUT. It also prevents cooling fluid from entering the objective housing when it is docked to the docking port 520.

Figure 6:
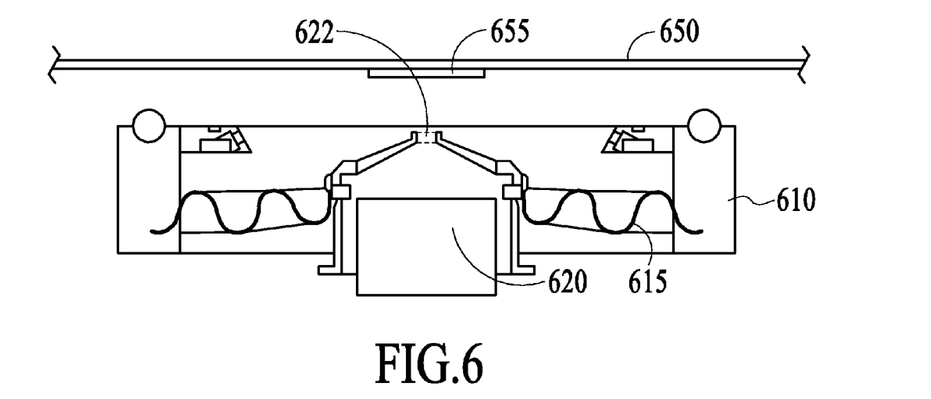
FIG. 6 illustrates a further embodiment of the invention.

FIG. 6 illustrates a further embodiment of the invention. In FIG. 6, the DUT 655 is attached to a holder or adapter 650. Frame 610 is positioned about the DUT 655. An optional seal or porous seal 652 may be provided between the frame 610 and adapter 650. A docking port 620 is resiliently affixed to the frame 610 via sealing sleeve 615. A shield 622 is provided on the docking port 620 so as to prevent spray fluid from reaching the area inside the shield 622. The shield 622 may be made of, e.g., o-ring, etc., so that when it is in contact with the DUT 655 it prevents cooling fluid from reaching the area of the DUT defined by the shield 622. This also prevents cooling fluid from entering the objective housing when it is docked to the docking port 620.

Figure 7:
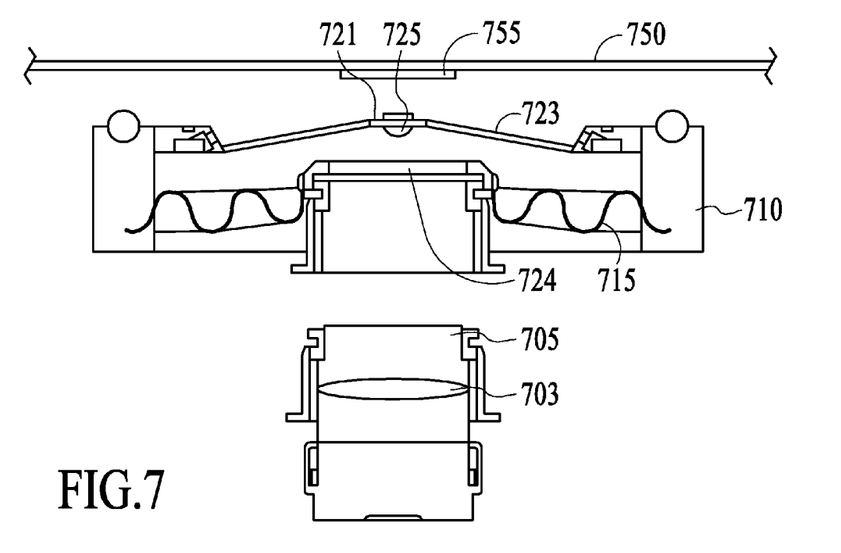
FIG. 7 illustrates yet another embodiment of the invention.

FIG. 7 illustrates yet another embodiment of the invention. In FIG. 7, the DUT 755 is attached to a holder or adapter 750. Frame 710 is positioned about the DUT 755. An optional seal or porous seal 752 may be provided between the frame 710 and adapter 750. A docking port 720 is resiliently affixed to the frame 710 via sealing sleeve 715. A SIL 725 is positioned within a ring 721, which is in turn held by support 723. The support 723 may or may not be affixed to the frame 710. The ring 721 and support 723 may be designed to be similar to that shown in U.S. Patent Application 2005/0094258. A transparent window 724 is provided on the docking port 720 to prevent cooling fluid from entering the objective housing when it is docked to the docking port 720.

Figure 8:
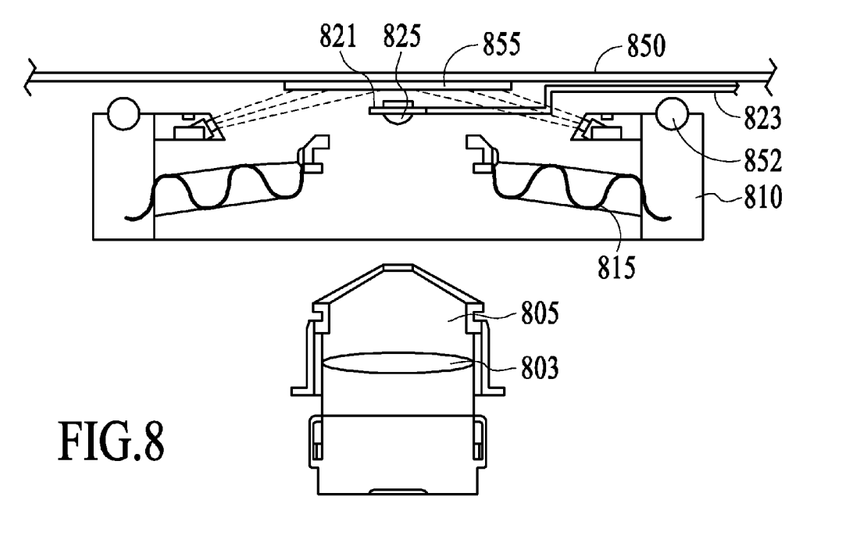
FIG. 8 illustrates yet another embodiment of the invention.

FIG. 8 illustrates yet another embodiment of the invention. In FIG. 8, the DUT 855 is attached to a holder or adapter 850. Frame 810 is positioned about the DUT 855. An optional seal or porous seal 852 may be provided between the frame 810 and adapter 850. A SIL 825 is positioned within a ring 821, which in turn is affixed to a manipulation rod 823. Manipulation rod 823 is used to position the SIL 825 at the desired location on the DUT 855. The objective lens is then aligned optically to the SIL, or it may simply be attached to the sleeve 815. Therefore, in this embodiment no docking port is needed. Rather, the objective can be aligned to the SIL 825 optically.

Figure 9:
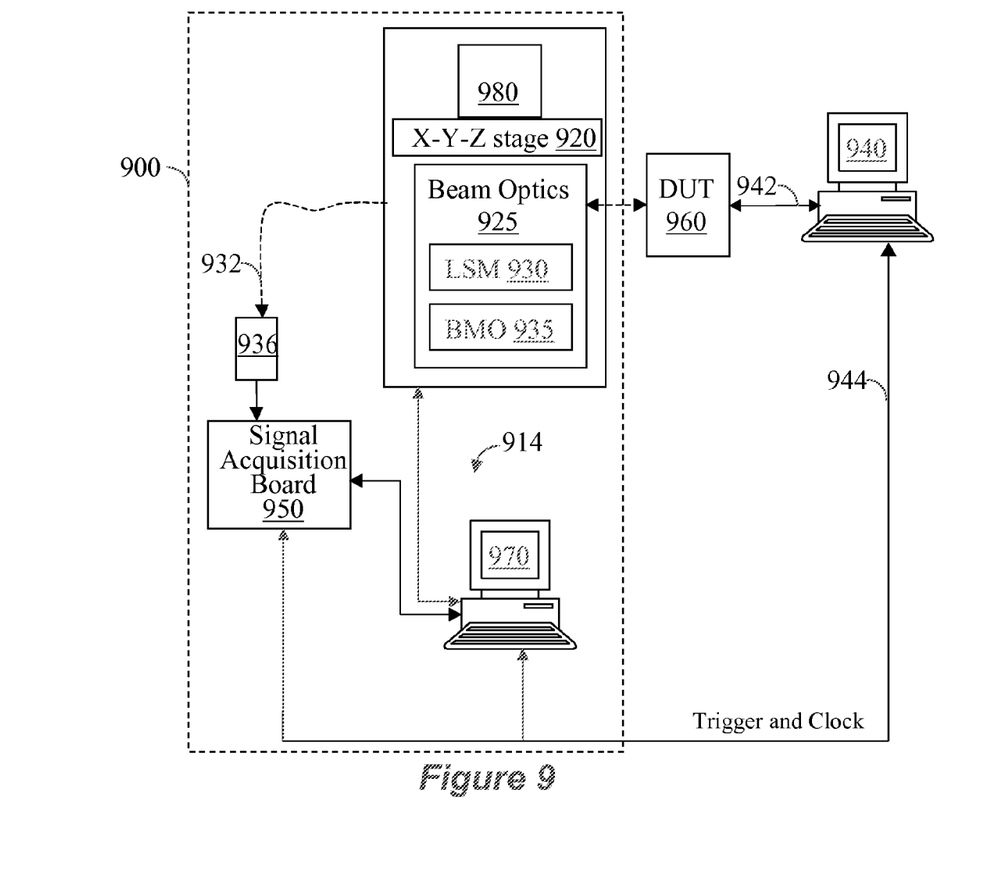
FIG. 9 is a schematic diagram illustrating an embodiments for systems according to the invention.

FIG. 9 is a schematic diagram illustrating an embodiments for systems according to the invention. In FIG. 9, DUT 960 is undergoing testing by, for example, receiving test vectors 942 from tester 940, such as an ATE (Automated Testing Equipment or Automated Testing and Evaluation). Alternatively, the DUT 960 may be provided with simple power-on signal or simple clock cycle signal. The DUT 960 may be mounted onto optical tester 900, such as emission microscope, e.g., Meridian®, time resolved emission, e.g., EmiScope®, laser voltage prober, e.g., Ruby™, all available from DCG Systems of Fremont, Calif. Generally, the optical tester 900 would include an x-y stage 920 for navigation over the DUT 960, a beam manipulation optics, BMO 935, consisting various optical elements, such as lenses and/or mirrors for shaping and/or conditioning the beam, and scanning mechanism, such as a laser scanning microscope 930. These elements are generic and not pertinent to the embodiments of the invention.

By the use of the above noted testing elements, light reflection or photon emission is collected from various areas of the DUT by, e.g., fiber optics 934, and is sensed by photon sensor 936, such as an avalanche photodiode (APD). Of course, other elements or arrangements may be used for collecting the reflection or emission. A signal acquisition board 950 may be coupled to the sensor to receive and condition the signal of the sensor 936. The signal is then applied to a processor 970, such as a specifically programmed PC. As shown, the processor 970 may also be used to control the various elements of the optical tester 900. Additionally, trigger and clock signal may be provided from the tester 940 to the signal acquisition board 950 and/or the processor 970.

In order to collect light reflection or emission from the DUT, collection optics 980 is provided in accordance with any of the embodiments shown in FIGS. 1-8. In this manner, the turret is used to point a lower magnification, wider field of view objective to the DUT in order to navigate over the DUT and locate a feature of interest. Then the turret is lowered to disengage the lower magnification objective, the turret is rotated to align a higher magnification objective with the DUT, and the turret is then raised to dock the higher magnification objective. The testing of the DUT can then commence, as the higher objective is already aligned to the feature of interest by reason of it being docked to the SIL housing that was aligned to the feature of interest using the lower magnification objective.

The present invention has been described in relation to particular examples, which are intended in all respects to be illustrative rather than restrictive. Those skilled in the art will appreciate that many different combinations of functional elements will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the relevant arts. It is intended that the specification and examples be considered as exemplary only, with a true scope and spirit of the invention being indicated by the following claims.

The invention claimed is:

1. A collection optics system comprising:
   a turret having a plurality of objective housings affixed thereto;
   a frame positioned in registration to the turret;
   docking port mounted onto the frame to which one of the plurality of objective housings can dock at a time;
   a vertical motion mechanism imparting vertical motion to the turret;
   wherein the vertical motion mechanism raises the turret so as to dock one of the objective housings onto the docking port, and lowers the turret so as to disengage a docked objective housing from the docking port such that the objective housing is disengaged from the docking port; and,
   a turret rotation mechanism configured to rotate the turret such that when a different objective housing is needed, the objective housing is undocked from the docking port, the turret is rotated, and another objective housing is docked into the docking port instead; and,
   further comprising a spray cool mechanism configured to spray cooling liquid onto an observed specimen so as to cool the specimen during observation.

2. The collection optics of claim 1, wherein the docking port is resiliently mounted onto the frame.

3. The collection optics of claim 1, wherein the frame and the turret are affixed to an x-y stage.

4. The collection optics of claim 1, wherein the spray cool mechanism comprises a spray cool block attached to the frame.

5. The collection optics of claim 4, wherein the spray cool block comprises a plurality of fluid injectors.

6. The collection optics of claim 1, further comprising a transparent window attached to the docking port.

7. The collection optics of claim 6, wherein the window comprises a sapphire window or diamond window.

8. The collection optics of claim 1, further comprising a solid immersion lens attached to the docking port.

9. The collection optics of claim 1, further comprising a solid immersion lens positioned within the frame.

10. The collection optics of claim 9, further comprising a ring supporting the solid immersion lens within the frame.

11. The collection optics of claim 1, further comprising a shield attached to the docking port.

12. The collection optics of claim 1, wherein the vertical motion mechanism is configured to dock one of the objective housings onto the docking port such that as the vertical motion mechanism moves the turret up and down small amounts, the docking port moved with the objective housing.

13. The collection optics of claim 1, wherein the docking port comprises a solid immersion lens housing having a solid immersion lens attached thereto.

14. The collection optics of claim 1, further comprising a seal provided on top of the frame to contact an adapter supporting a specimen.

15. A collection optics, system comprising:
a turret having a plurality of objective housings affixed thereto;
a frame positioned in registration to the turret;
docking port mounted onto the frame to which one of the plurality of objective housings can dock at a time;
a vertical motion mechanism imparting vertical motion to the turret;
wherein the vertical motion mechanism raises the turret so as to dock one of the objective housings onto the docking port, and lowers the turret so as to disengage a docked objective housing from the docking port such that the objective housing is disengaged from the docking port; and,
a turret rotation mechanism configured to rotate the turret such that when a different objective housing is needed, the objective housing is undocked from the docking port, the turret is rotated, and another objective housing is docked into the docking port instead;
and further comprising a sealing sleeve attaching the docking port to the frame and configured to return the docking port to its free position when the objective housing is disengaged from the docking port.

16. The collection optics of claim 15, further comprising a spray cool mechanism configured to spray cooling liquid onto an observed specimen so as to cool the specimen during observation.

17. A collection optics, system comprising:
a turret having a plurality of objective housings affixed thereto;
a frame positioned in registration to the turret;
docking port mounted onto the frame to which one of the plurality of objective housings can dock at a time;
a vertical motion mechanism imparting vertical motion to the turret;
wherein the vertical motion mechanism raises the turret so as to dock one of the objective housings onto the docking port, and lowers the turret so as to disengage a docked objective housing from the docking port such that the objective housing is disengaged from the docking port; and,
a turret rotation mechanism configured to rotate the turret such that when a different objective housing is needed, the objective housing is undocked from the docking port, the turret is rotated, and another objective housing is docked into the docking port instead;
wherein the docking port comprises a solid immersion lens housing having a solid immersion lens attached thereto;
and further comprising a sealing sleeve wherein the sealing sleeve forms a resilient attachment between the solid immersion lens housing and the frame.

18. The collection optics of claim 17, further comprising a spray cool mechanism configured to spray cooling liquid onto an observed specimen so as to cool the specimen during observation.

19. A collection optics system comprising:
a turret having a plurality of objective housings affixed thereto;
a frame positioned in registration to the turret;
docking port mounted onto the frame to which one of the plurality of objective housings can dock at a time;
a vertical motion mechanism imparting vertical motion to the turret;
wherein the vertical motion mechanism raises the turret so as to dock one of the objective housings onto the docking port, and lowers the turret so as to disengage a docked objective housing from the docking port such that the objective housing is disengaged from the docking port; and,
a turret rotation mechanism configured to rotate the turret such that when a different objective housing is needed, the objective housing is undocked from the docking port, the turret is rotated, and another objective housing is docked into the docking port instead;
and further comprising:
spray cooling arrangement configured to spray cooling liquid onto an observed specimen so as to cool the specimen during observation;
a spring-loaded sleeve configured to form a seal extending between the frame and the docking port.

20. The collection optics of claim 19, wherein the spray cooling arrangement comprises cooling blocks having plurality of injection holes configured to spray liquid onto the observed specimen.

21. A collection optics system comprising:
a turret having a plurality of objective housings affixed thereto;
a frame positioned in registration to the turret;
docking port mounted onto the frame to which one of the plurality of objective housings can dock at a time;
a vertical motion mechanism imparting vertical motion to the turret;
wherein the vertical motion mechanism raises the turret so as to dock one of the objective housings onto the docking port, and lowers the turret so as to disengage a docked objective housing from the docking port such that the objective housing is disengaged from the docking port; and,
a turret rotation mechanism configured to rotate the turret such that when a different objective housing is needed, the objective housing is undocked from the docking port, the turret is rotated, and another objective housing is docked into the docking port instead;
wherein the docking port comprises a solid immersion lens housing having a solid immersion lens attached thereto;

wherein the vertical motion mechanism is configured to dock one of the objective housings onto the docking port such that as the vertical motion mechanism moves the turret up, the docking port moved with the objective housing such that the solid immersion lens contacts a specimen.

22. The collection optics of claim 21, further comprising a spray cool mechanism configured to spray cooling liquid onto an observed specimen so as to cool the specimen during observation.

* * * * *